(12) United States Patent
Chen

(10) Patent No.: US 12,710,701 B2
(45) Date of Patent: Aug. 18, 2026

(54) MASK INSPECTION APPARATUS

(71) Applicant: STEK CO., LTD., New Taipei City (TW)

(72) Inventor: Ming-Sheng Chen, New Taipei City (TW)

(73) Assignee: STEK CO., LTD., New Taipei City (TW)

( * ) Notice: Subject to any disclaimer, the term of this patent is extended or adjusted under 35 U.S.C. 154(b) by 535 days.

(21) Appl. No.: 18/224,062

(22) Filed: Jul. 20, 2023

(65) Prior Publication Data

US 2024/0027895 A1 Jan. 25, 2024

(30) Foreign Application Priority Data

Jul. 21, 2022 (CN) ........................ 202210863476.2

(51) Int. Cl.
*G03F 7/00* (2006.01)
*G01N 21/88* (2006.01)
*G03F 1/84* (2012.01)

(52) U.S. Cl.
CPC ..... *G03F 7/70725* (2013.01); *G01N 21/8806* (2013.01); *G03F 7/70653* (2023.05); *G03F 7/70825* (2013.01); *G03F 7/70833* (2013.01); *G03F 7/7085* (2013.01); *G03F 1/84* (2013.01)

(58) Field of Classification Search
CPC ............ G03F 7/70725; G03F 7/70653; G03F 7/70825; G03F 7/70833; G03F 7/7085; G03F 1/84; G03F 1/66; G01N 21/8806; G01N 21/954; G01N 21/956
See application file for complete search history.

(56) References Cited

U.S. PATENT DOCUMENTS

2017/0131218 A1* 5/2017 Chang ................. G01N 21/956
2023/0176473 A1* 6/2023 Chen ................. G02B 27/0006
206/454

* cited by examiner

*Primary Examiner* — Tarifur R Chowdhury
*Assistant Examiner* — Akbar H. Rizvi
(74) *Attorney, Agent, or Firm* — Bruce Stone LLP; Joseph A. Bruce

(57) ABSTRACT

A mask inspection apparatus includes a booth, a carrier, two linear scanners, a light source module and a control unit. The booth includes a platform including a slot. The carrier is movable along the slot. The carrier includes a support face for supporting the mask, guiding elements on the support face, and an inspection window in the support face. The support face extends above the platform. The linear image scanners are vertically movable respectively below and above the platform. The light source module includes two light boxes on the platform. The light boxes are operable to cast light on an upper face of the mask in an upper position. The light boxes are operable to cast light on a lower face of the mask in a lower position. The control unit is electrically connected to the carrier, the linear image scanner and the light source module.

15 Claims, 11 Drawing Sheets

MASK INSPECTION APPARATUS

BACKGROUND OF INVENTION

1. Field of Invention

The present invention relates to masks for production of semiconductor products and, more particularly, to a mask inspection apparatus.

2. Related Prior Art

A mask must be located in a highly clean and air-tight and anti-static transparent container, i.e., a reticle SMIF pod ("RSP") to keep the mask from contamination and resultant defection during transportation or storage. However, the RSP has to be opened to allow the mask to be taken from the RSP to be covered by a protective film (protective film (108)) or inspected.

On such occasions, particles or other contaminants can be attached to the mask. Repeated opening and closing of the RSP can entail friction or impacts that can produce particles or generate static charges that increase the risks of the mask being contaminated. A clean room in which such processes are executed must be upgraded. Furthermore, the mask must be cleaned more frequently and/or sent back to a manufacturer for maintenance faster than scheduled. As lithographic processes are getting more sophisticated and expensive, such masks must be protected better than before.

Moreover, scrutinizing of the protective film, the mask and a pattern of a circuit on the mask with a conventional mask inspection apparatus is affected by the position of a light source, the angle of a light beam from the light source, translucency and resolution. To minimize the affection, use of two mask inspection apparatuses to inspect two opposite sides of the mask is preferred to use of a mask inspection apparatus and flipping the mask to allow the opposite sides of the mask to be inspected one after another. Unfortunately, it is expensive to buy or maintain such a mask inspection apparatus. In addition, such a mask inspection apparatus requires mechanisms for feeding, storing and opening the RSP, thereby increasing the size and cost of such a mask inspection apparatus.

The present invention is therefore intended to obviate or at least alleviate the problems encountered in the prior art.

SUMMARY OF INVENTION

It is an objective of the present invention to provide a mask inspection apparatus for scrutinizing a mask without having to open a RSP that contains the mask.

It is another objective of the present invention to provide a mask inspection apparatus for scrutinizing a mask without having to feed the mask into the mask inspection apparatus twice.

To achieve the foregoing objectives, the mask inspection apparatus includes a booth, a carrier, two linear scanners, a light source module and a control unit. The booth includes a framework, a platform on the framework, and a slot in the platform. The carrier is movable along the slot in the platform. The carrier includes a support face for supporting the mask, guiding elements on the support face, and an inspection window in the support face. The support face extends above the platform. The first linear image scanner is vertically movable below the platform. The second linear image scanner is vertically movable above the platform. The light source module includes two light boxes on the platform and vertically movable between an upper position and a lower position. The light boxes are operable to cast light on an upper face of the mask in the upper position, wherein the light boxes are operable to cast light on a lower face of the mask in the lower position. The control unit is electrically connected to the carrier, the linear image scanner and the light source module. The control unit includes a memory unit for storing programs to be executed and data about the inspection. A display is electrically connected to the control unit to show commands to be executed by the control unit and results of the inspection.

Other objectives, advantages and features of the present invention will be apparent from the following description referring to the attached drawings.

BRIEF DESCRIPTION OF DRAWINGS

The present invention will be described via detailed illustration of the preferred embodiment referring to the drawings wherein.

DETAILED DESCRIPTION OF PREFERRED EMBODIMENT

Figure 1A:
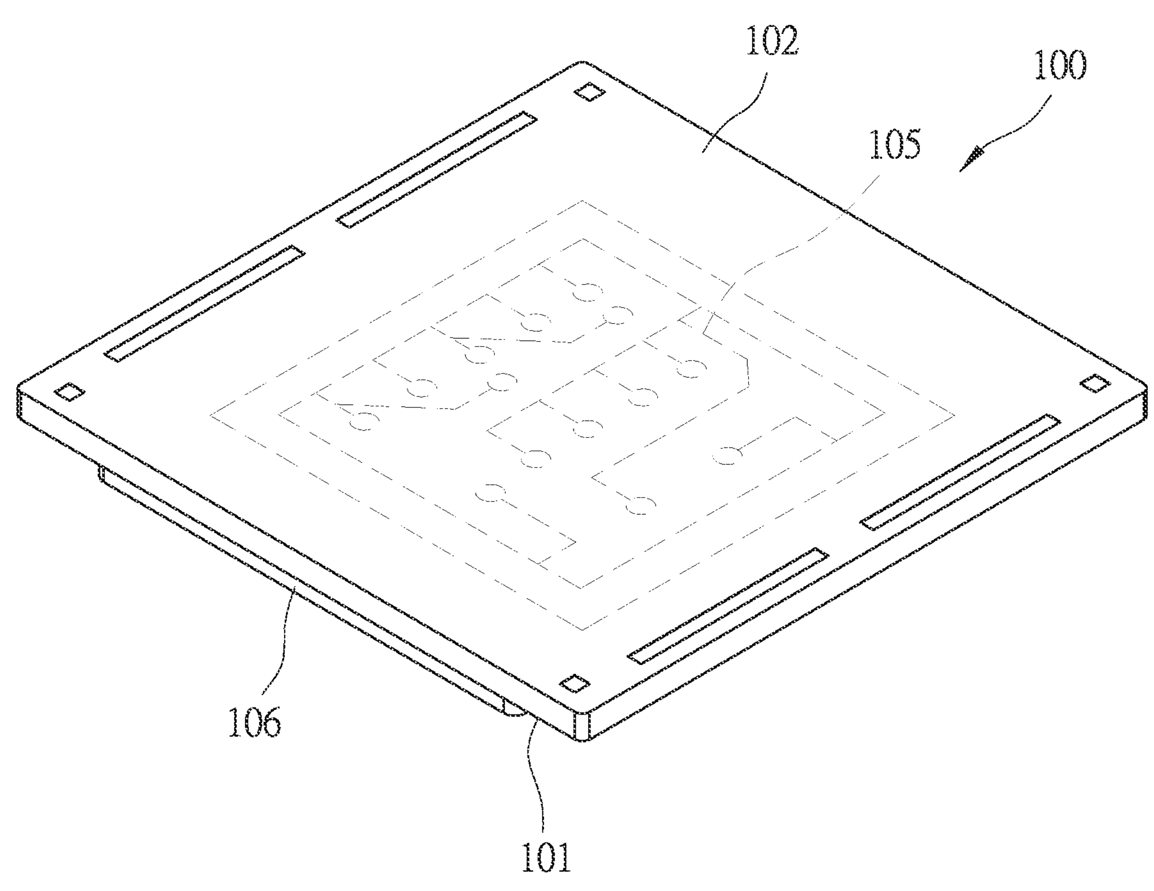
FIG. 1A is a perspective view of a mask.
Figure 1B:
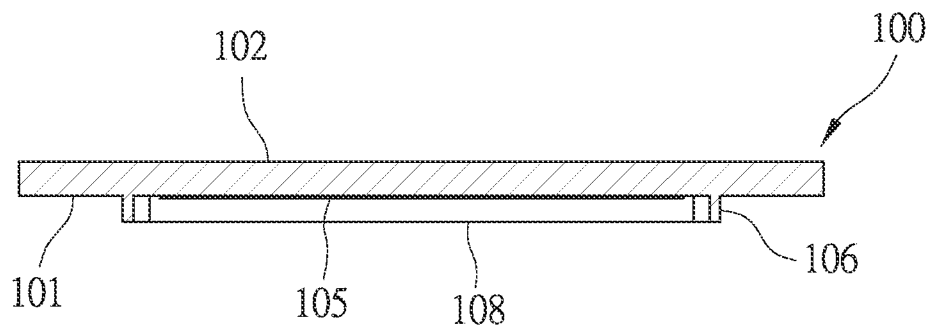
FIG. 1B is a cross-sectional view of the mask shown in FIG. 1.

Referring to FIGS. 1A, 1B, 2A, 2B and 3, a mask 100 or the like located in a transparent container 200 is scrutinized with a mask inspection apparatus according to the preferred embodiment of the present invention. Referring to FIGS. 1A and 1B, the mask 100 includes a lower face 101 in parallel to an upper face 102. The lower face 101 is provided with a pattern 105 transferable to a wafer by light. A frame 106 formed on the lower face 101 of the mask 100 receives or supports protective film 108 for the pattern 105.

Figure 2A:
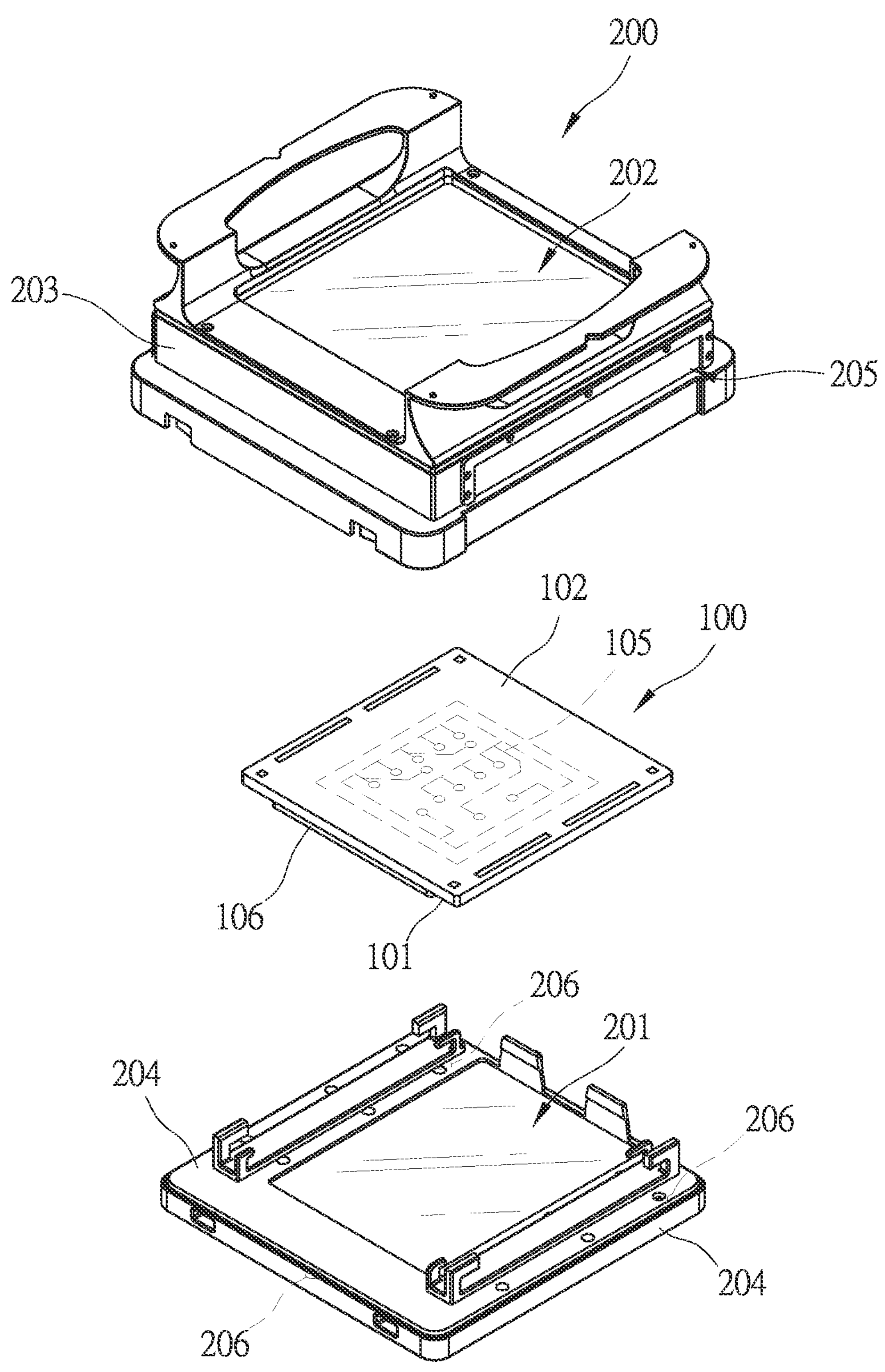
FIG. 2A is an exploded view of a transparent container and the mask depicted in FIG. 1.
Figure 2B:
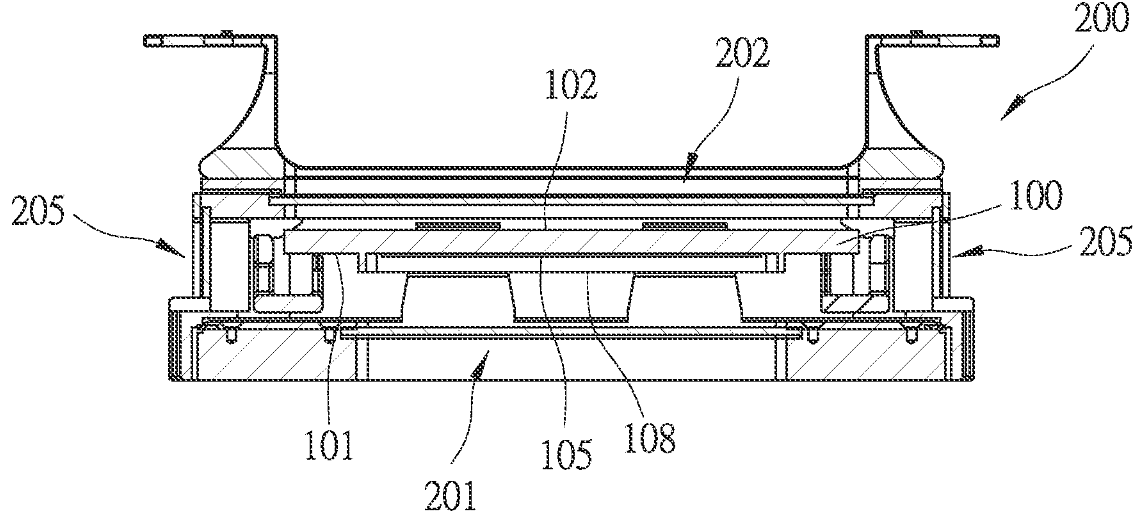
FIG. 2B is a cross-sectional view of the transparent container and the mask shown in FIG. 2A.

Referring to FIGS. 2A and 2B, the transparent container 200 preferably includes a cover 203 and a base 204. To receive the mask 100, the transparent container 200 is opened, i.e., the cover 203 is taken from the base 204. To keep the mask 100 in the transparent container 200, the cover 203 is laid on the base 204, i.e., the transparent container 200 is closed.

The transparent container 200 includes a lower window 201 in the base 204, an upper window 202 in the cover 203, and two opposite lateral windows 205 in the cover 203. The lower window 201 is similar to but preferably larger than the lower face 101 of the mask 100. The upper window 202 is similar to but preferably larger than the upper face 102 of the mask 100. The lateral windows 205 are similar to but preferably larger than lateral faces (or "edges") of the mask 100. Light can be cast on the upper face 102 of the mask 100 via the upper window 202. Light can be cast on the lower face 101 of the mask 100 through the lower window 201. Light can be cast on the lateral faces of the mask 100 via the lateral windows 205.

Figure 3:
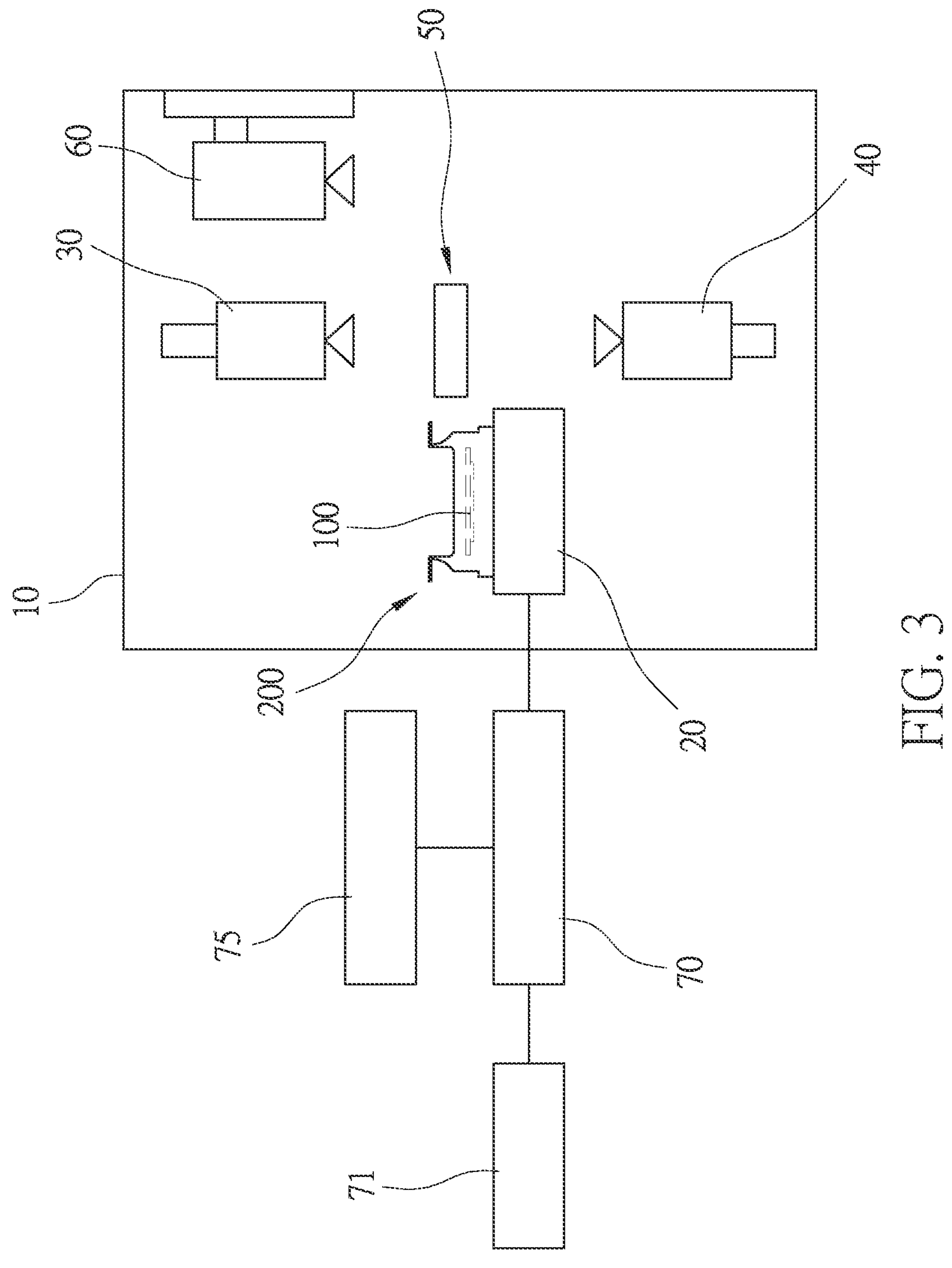
FIG. 3 is a block diagram of a mask inspection apparatus according to the preferred embodiment of the present invention, operable for scrutinizing the mask shown in FIG. 1.
Figure 4:
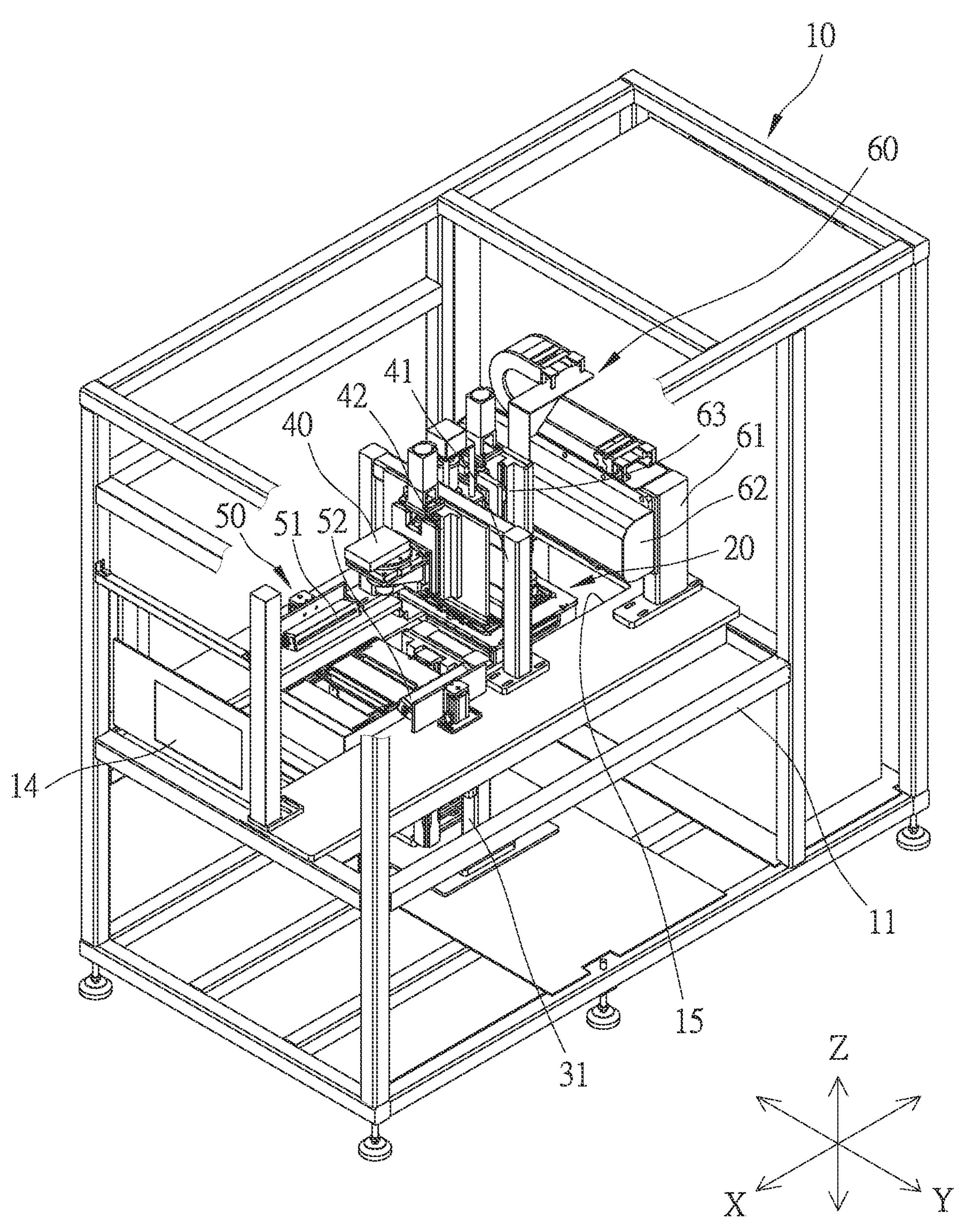
FIG. 4 is a perspective view of the mask inspection apparatus shown in FIG. 3.

Referring to FIGS. 3 and 4, the mask inspection apparatus operable to scrutinize the mask 100 includes a booth 10 for supporting a carrier 20, a linear image scanner 30, a linear image scanner 40, a light source module 50, an area image sensor 60 and a control unit 70. The carrier 20 is configured corresponding to various tests to be run on the mask 100. In inspection, the mask 100 alone is located on the carrier 20 or the mask 100 is located in the transparent container 200 before they both are located on the carrier 20.

Referring to FIG. 4, the booth 10 includes framework 11 for supporting panels (not shown). The framework 11 includes columns (not numbered) and beams (not numbered). The booth 10 includes a gate 14 in a side. The gate 14 is electrically connected to the control unit 70 so that the gate 14 is opened or closed under the control of the control unit 70. A platform 15 is supported on the framework 11 to divide the interior of the booth 10 into an upper space and a lower space. The platform 15 includes apertures via which air travels between the upper and lower spaces of the booth 10. The platform 15 further includes a slot 16 for receiving the carrier 20 so that the carrier 20 is translatable on the platform 15 along an X-axis. In addition, there are a Y-axis horizontally extending in perpendicular to the X-axis and a Z-axis vertically extending in perpendicular to the X-axis and the Y-axis.

Figure 5:
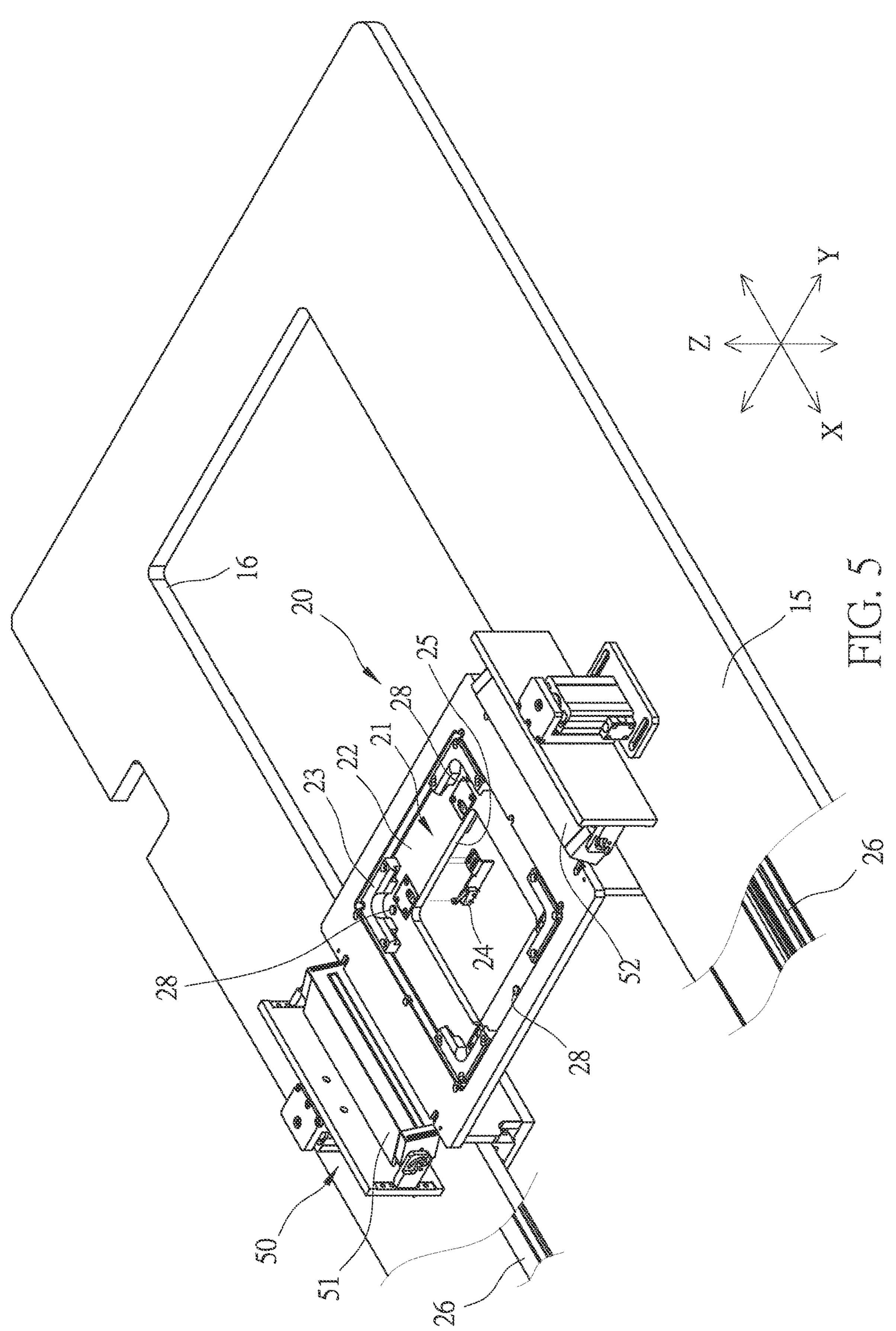
FIG. 5 is a perspective view of a carrier of the mask inspection apparatus shown in FIG. 4.

The carrier 20 is electrically connected to the control unit 70 so that the carrier 20 is translated or stopped on the platform 15 under the control of the control unit 70. The carrier 20 carries the mask 100 alone or the mask 100 located in the transparent container 200. Preferably, the mask 100 is located in the transparent container 200 before they both are located on the carrier 20 (FIG. 5).

The carrier 20 includes a plate 21, guiding elements 23 and a sensor 24. The plate 21 includes a support face 22 extending lower than a marginal portion of the plate 21. The guiding elements 23 are located on the support face 22 at corners. The guiding elements 23 define a region compliant to the base 204 of the transparent container 200 so that the transparent container 200 can precisely be located on the support face 22 of the plate 21.

The sensor 24 is located lower than the support face 22. The sensor 24 is electrically connected to the control unit 70 so that the sensor 24 is operable by the control unit 70. The sensor 24 detects whether the base 204 of the transparent container 200 is in tight contact with the support face 22.

Moreover, the plate 21 includes an inspection window 25 in the support face 22 corresponding to the lower window 201 of the transparent container 200 located on the support face 22.

Positioning bosses 28 extend from the support face 22 around the inspection window 25. The positioning bosses 28 are insertable in bores 206 made in the base 204 of the transparent container 200 (FIG. 2A) so that the transparent container 200 is precisely and firmly located on the support face 22.

Two tracks 26 extends on a lower face of the platform 15 along two opposite internal edges of the platform 15 by the slot 16, i.e., in parallel to the X-axis. Thus, the tracks 26 are located on two opposite sides of the plate 21. The carrier 20 is movable along the tracks 26. Thus, the carrier 20 carries the transparent container 200 along the X-axis under the control of the control unit 70.

Figure 7:
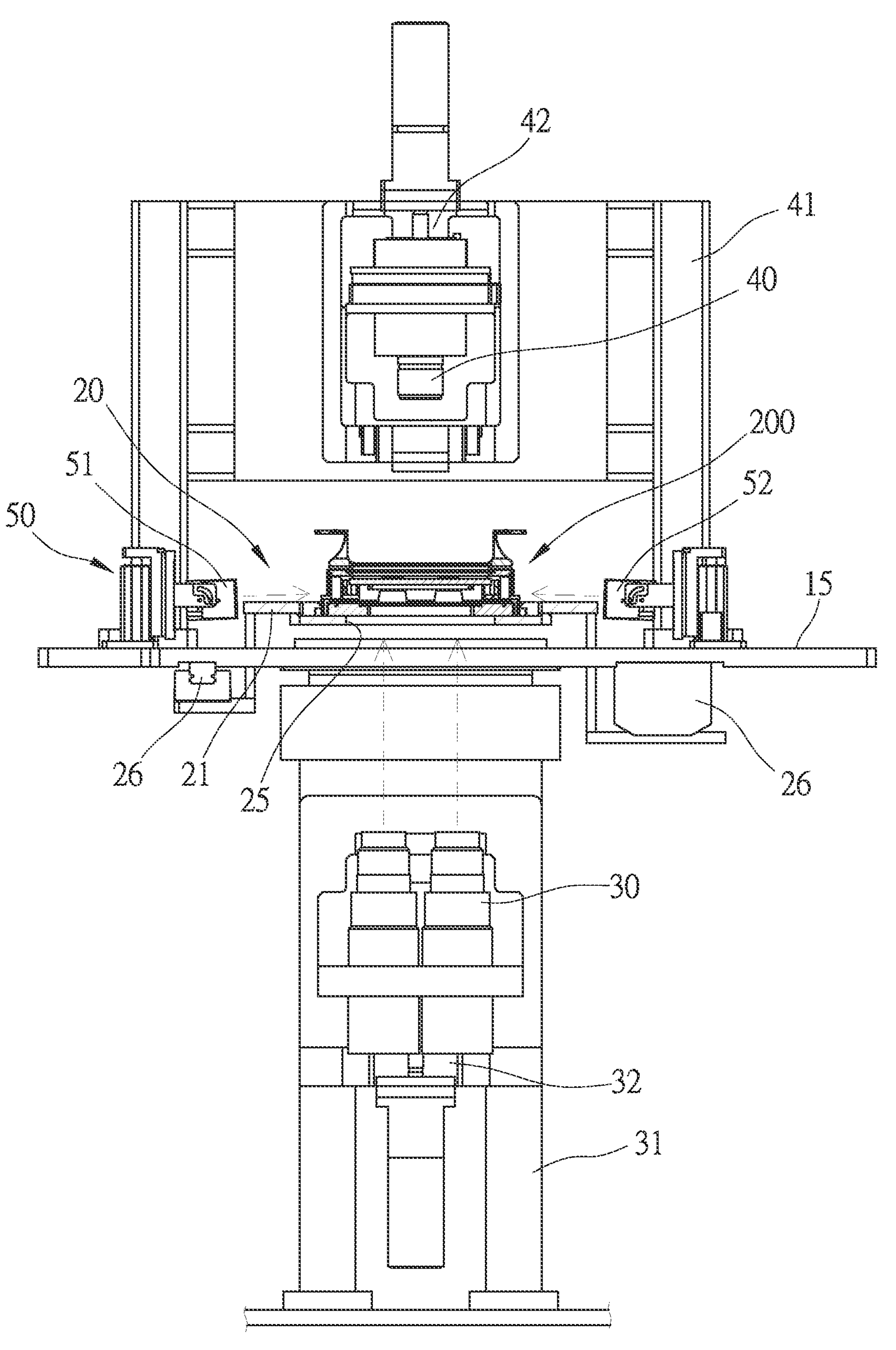
FIG. 7 is a front view of the mask inspection apparatus shown in FIG. 4 in a phase of scrutinizing the mask shown in FIG. 1.
Figure 8:
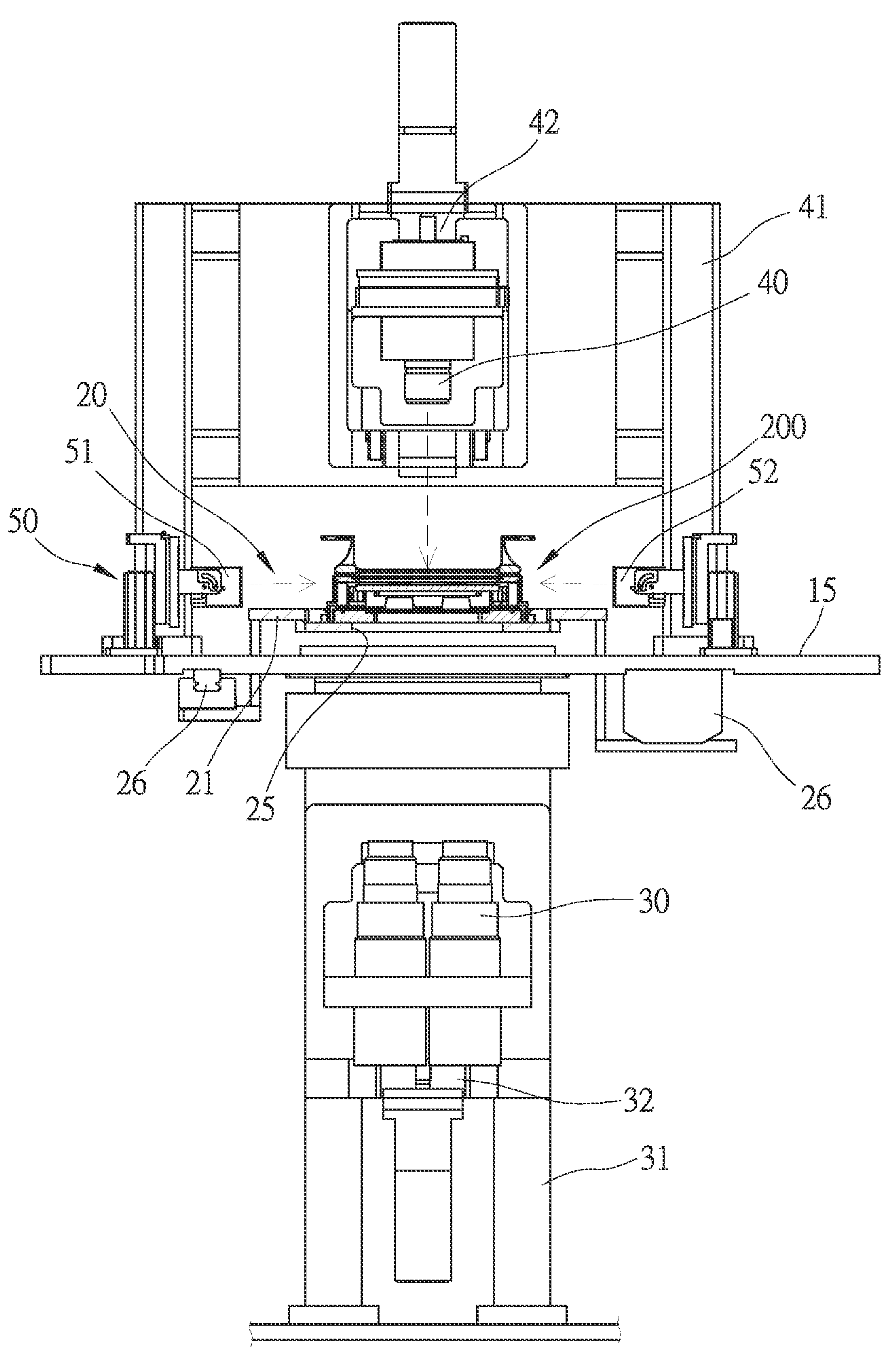
FIG. 8 is a front view of the mask inspection apparatus shown in FIG. 4 in another phase of scrutinizing the mask shown in FIG. 1.

Moreover, the linear image scanners 30 and 40 are respectively above and below the platform 15. The linear image scanners 30 and 40 are both electrically connected to the control unit 70. Referring to FIGS. 7 and 8, the linear image scanners 30 and 40 are located corresponding to the path of the movement of the carrier 20. A post 31 is used to support the image scanner 30 on the framework 11 of the booth 10. A post 42 is used to support the image scanner 40 on the framework 11 of the booth 10. The post 31 is connected to a vertical track 32 for the image scanner 30. The post 41 is connected to a vertical track 42 for the image scanner 40. Thus, the linear image scanners 30 and 40 are movable along the Z-axis. The image scanner 30 scans the lower face 101 of the mask 100. The image scanner 40 scans the upper face 102 of the mask 100.

Figure 6:
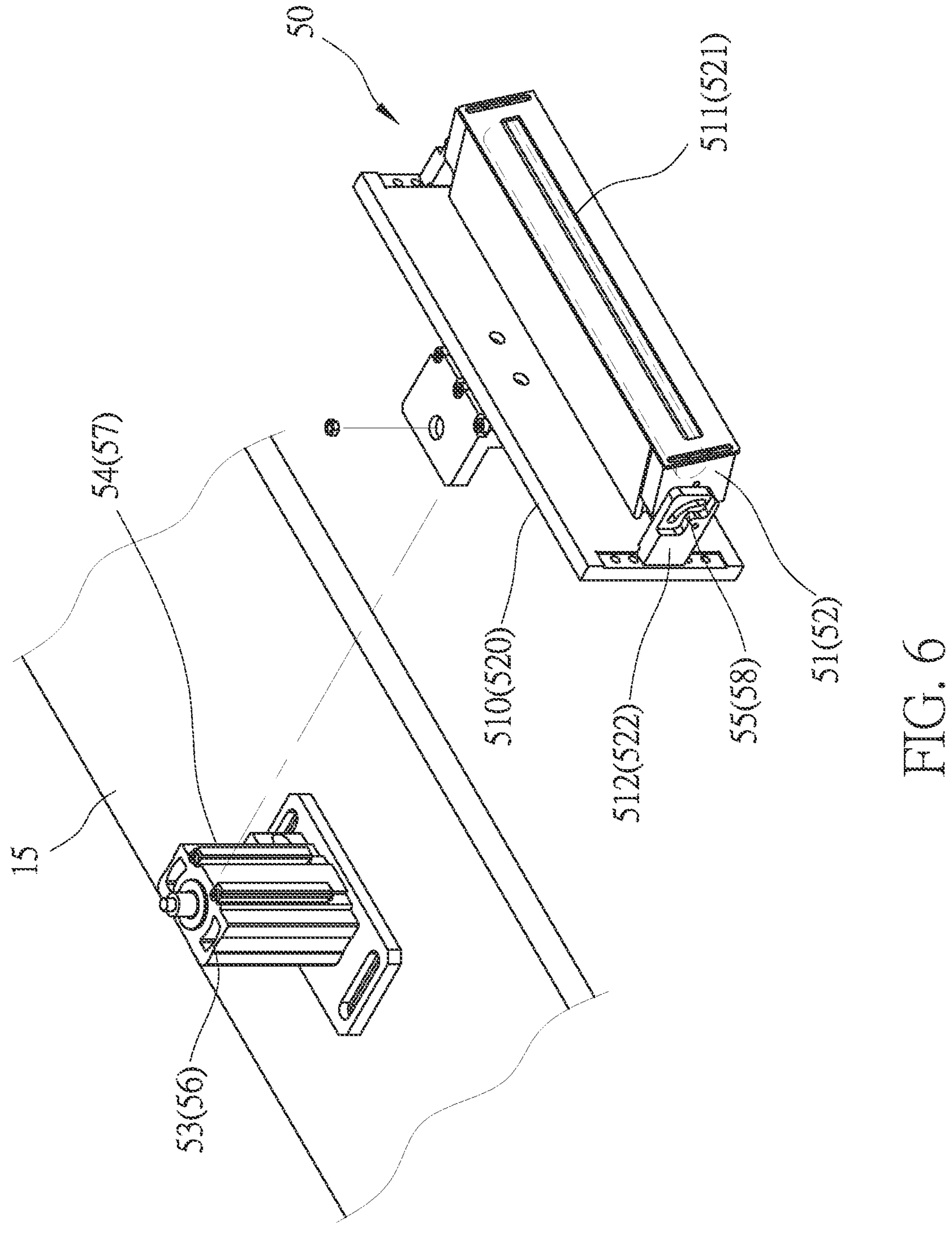
FIG. 6 is a perspective view of a light source module of the mask inspection apparatus shown in FIG. 4.

The light source module 50 is electrically connected to the control unit 70 so that the light module 50 emits light under the control of the control unit 70. The light source module 50 includes two light boxes 51 and 52, two vertical planks 510 and 520 and two columns 53 and 56 (FIGS. 5 and 6). The light boxes 51 and 52 are located between the linear image scanners 30 and 40.

The column 53 is formed on the platform 15, on a side of the slot 16. The column 53 includes a track 54 along which the vertical plank 510 is movable in parallel to the Z-axis. The vertical plank 510 includes two lugs 512. The light box 51 is formed with two pivots 55 extending in parallel to the X-axis. The pivots 55 are inserted in the lugs 512 so that the light box 51 is pivotable relative to the vertical plank 510. The light box 51 includes a slit 511 in parallel to the X-axis. Thus, the light box 51 is allowed to cast light on the upper face 102 or the lower face 101 of the mask 100 at angle of 0 to 6 degrees (FIGS. 7 and 8).

The column 56 is formed on the platform 15, on an opposite side of the slot 16. The column 56 includes a track 57 along which the vertical plank 520 is movable in parallel to the Z-axis. The vertical plank 520 includes two lugs 522. The light box 52 is formed with two pivots 58 extending in parallel to the X-axis. The pivots 58 are inserted in the lugs 522 so that the light box 52 is pivotable relative to the vertical plank 520. The light box 52 includes a slit 521 in parallel to the X-axis. Thus, the light box 52 is allowed to cast light on the upper face 102 or the lower face 101 of the mask 100 at angle of 0 to 6 degrees (FIGS. 7 and 8).

Figure 9:
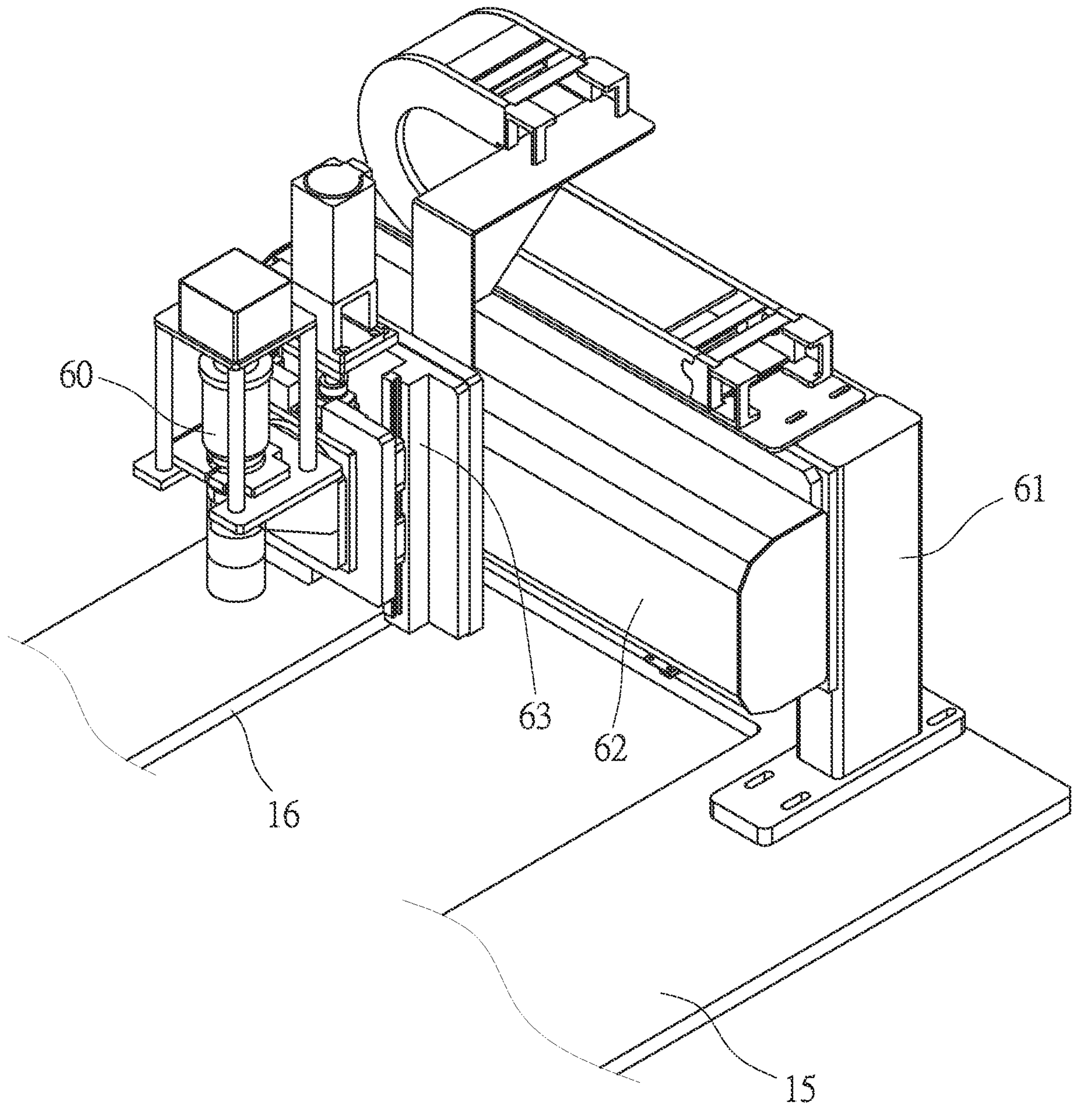
FIG. 9 is an enlarged partial view of the mask inspection apparatus shown in FIG. 4 in scrutinizing a pattern of a circuit on the mask shown in FIG. 1.

Referring to FIG. 9, the area image sensor 60 is supported on the platform 15 via a stem 61 and two tracks 62 and 63. The stem 61 vertically extends from the plat form 15. The track 62 horizontally extends from the stem 61. The track 63 is movable along the track 62 in parallel to the Y-axis. The track 63 extends vertically. The image sensor 60 is movable along the track 63 in parallel to the Z-axis and along the platform 15 in parallel to the Y-axis. The area image sensor 60 is electrically connected to the control unit 70 so that the area image sensor 60 senses the pattern 105 on the mask 100 in the transparent container 200 on the carrier 20 (FIGS. 1A and 9). The area image sensor 60 is operable to cast light upward or downward.

Referring to FIG. 3, the control unit 70 controls the above-mentioned elements of the mask inspection apparatus. For example, the control unit 70 controls the gate 14 to open or close, the carrier 20 to move, the linear image scanners 30 and 40 to scan, the light source module 50 to emit light, and the area image sensor 60 to move and scan. The control unit 70 includes at least one memory unit 71 for storing programs to be executed, data of the pattern 105 on the mask 100 (such as a designed layout of the pattern 105 and an image of the pattern 105 without any flaw), scanned images and results of inspection. The control unit 70 is electrically connected to display 75 preferably located out of the booth 10. Thus, the display 75 shows commands to be executed by the control unit 70 and images scanned by the linear image scanners 30 and 40 and the area image sensor 60. The control unit 70 includes at least one I/O unit (not shown) via which data of the pattern 105 can be transferred into or from the control unit 70.

Figure 10:
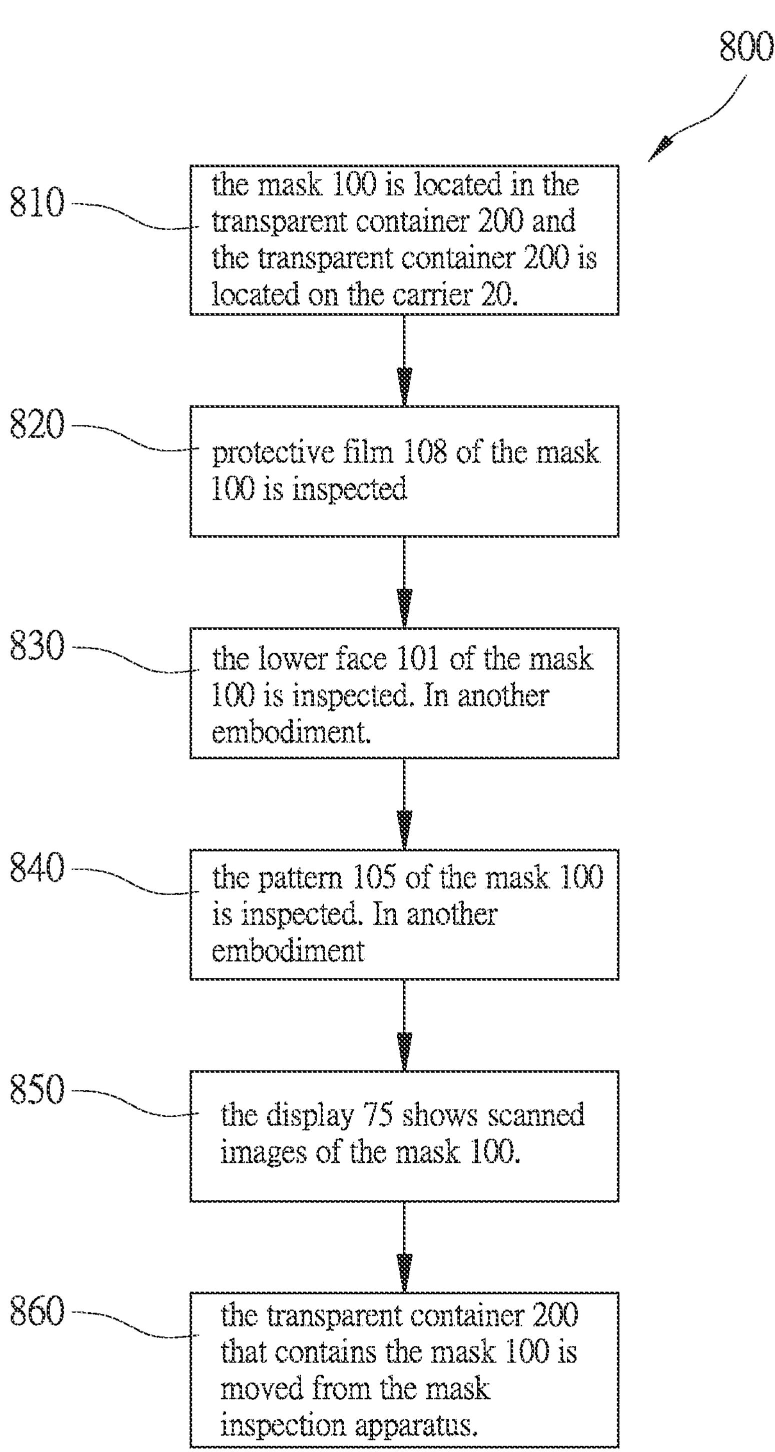
FIG. 10 is a flow chart of a process of using the mask inspection apparatus shown in FIG. 4 to inspect the mask shown in FIG. 1.

Referring to FIG. 10 in addition to FIGS. 3, 4 and 7 through 9, before the mask inspection apparatus executes an inspection process 800, the linear image scanners 30 and 40 are movable along the vertical tracks 32 and 42 in parallel to the Z-axis to cast the focuses of the linear image scanners 30 and 40 on the lower and upper faces 101 and 102 of the mask 100 in the transparent container 200. The image sensor 60 is moved along the track 63 in parallel to the Z-axis to cast the focus of the image sensor 60 on the pattern 105 of the mask 100 in the transparent container 200.

At 810, the mask 100 is located in the transparent container 200 and the transparent container 200 is located on the carrier 20.

At 820, protective film 108 of the mask 100 is inspected.

At 830, the lower face 101 of the mask 100 is inspected. In another embodiment, 820 can be switched with 830.

At 840, the pattern 105 of the mask 100 is inspected. In another embodiment, 840 can be executed without executing 820 and 830 in advance. In another embodiment, or 820 and 830 can be executed without executing 840.

At 850, the display 75 shows scanned images of the mask 100.

At 860, the transparent container 200 that contains the mask 100 is moved from the mask inspection apparatus.

The present invention has been described via the illustration of the preferred embodiment. Those skilled in the art can derive variations from the preferred embodiment without departing from the scope of the present invention. Therefore, the preferred embodiment shall not limit the scope of the present invention defined in the claims.

The invention claimed is:

1. A mask inspection apparatus operable for inspecting lower and upper faces of a mask without having to flip the mask, the mask inspection apparatus comprising:

- a booth comprising a framework, a platform on the framework, and a slot in the platform;
- a carrier movable along the slot in the platform, wherein the carrier comprises a support face for supporting the mask, guiding elements on the support face, and an inspection window in the support face, wherein the support face extends above the platform;
- a first linear image scanner vertically movable below the platform;
- a second linear image scanner vertically movable above the platform;
- a light source module comprising two light boxes on the platform and vertically movable between an upper position and a lower position, wherein the light boxes are operable to cast light on an upper face of the mask in the upper position, wherein the light boxes are operable to cast light on a lower face of the mask in the lower position;
- a control unit electrically connected to the carrier, the first and second linear image scanners and the light source module, wherein the control unit comprises a memory unit for storing programs to be executed and data about the inspection; and
- a display electrically connected to the control unit to show commands to be executed by the control unit and results of the inspection.

2. The mask inspection apparatus according to claim 1, wherein the mask inspection apparatus further comprises a transparent container for containing the mask before the transparent container is located on the support face, wherein the transparent container comprises a lower window corresponding to the lower face of the mask, an upper window corresponding to the upper face of the mask, and lateral windows corresponding to two lateral faces of the mask, wherein the carrier further comprises a sensor on the support face to detect whether a lower face of the transparent container is in proper contact with the support face.

3. The mask inspection apparatus according to claim 2, wherein the transparent container comprises bores, and the carrier comprises positioning bosses insertable in the bores to position the transparent container on the support face precisely and firmly.

4. The mask inspection apparatus according to claim 2, wherein the sensor detects whether a lower face of the transparent container is in proper contact with the support face.

5. The mask inspection apparatus according to claim 2, wherein the carrier further comprises a plate, wherein the support face is located in the plate, wherein the support face extends lower than a marginal portion of the plate around the support face.

6. The mask inspection apparatus according to claim 1, wherein the light source module further comprises two columns formed with two vertical tracks for guiding the light boxes.

7. The mask inspection apparatus according to claim 6, wherein the light source module further comprises two vertical planks movable along the vertical tracks, wherein the light boxes are pivotally connected to vertical planks respectively so that the light boxes are operable to cast light on the lower and upper faces (101, 102) of the mask at an angle of 0 to 6 degrees.

8. The mask inspection apparatus according to claim 1, further comprising an area image sensor electrically connected to the control unit and movable vertically and horizontally above the platform.

9. The mask inspection apparatus according to claim 8, further comprising a stem formed on the platform, a horizontal track connected to the stem, and a vertical track movable along the horizontal track, wherein the area image sensor is movable along the horizontal track.

10. The mask inspection apparatus according to claim 1, wherein the booth comprises a gate to allow access to the carrier on the platform, wherein the gate is electrically connected to the control unit.

11. The mask inspection apparatus according to claim 5, further comprising two tracks extending on a lower face of the platform on two opposite sides of the slot, wherein the carrier is movable along the tracks.

12. The mask inspection apparatus according to claim 1, wherein the guiding elements are located at corners of the support face.

13. The mask inspection apparatus according to claim 1, further comprising a first post formed on the framework of the booth below the platform and a first track formed on the first post, wherein the first linear image scanner is movable along the first track.

14. The mask inspection apparatus according to claim 1, further comprising a second post formed on the framework of the booth above the platform and a second track formed on the second post, wherein the second linear image scanner is movable along the second track.

15. The mask inspection apparatus according to claim 1, wherein each of the light boxes comprises a slit via which light is cast on the lower and upper faces of the mask.

* * * * *